(12) United States Patent
Suemasu

(10) Patent No.: US 8,728,854 B2
(45) Date of Patent: May 20, 2014

(54) SEMICONDUCTOR MATERIAL, SOLAR CELL USING THE SEMICONDUCTOR MATERIAL, AND METHODS FOR PRODUCING THE SEMICONDUCTOR MATERIAL AND THE SOLAR CELL

(75) Inventor: Takashi Suemasu, Tsukuba (JP)

(73) Assignee: Japan Science and Technology Agency, Kawaguchi-shi, Saitama (JP)

( * ) Notice: Subject to any disclaimer, the term of this patent is extended or adjusted under 35 U.S.C. 154(b) by 524 days.

(21) Appl. No.: 12/675,741

(22) PCT Filed: Aug. 27, 2008

(86) PCT No.: PCT/JP2008/065312
§ 371 (c)(1),
(2), (4) Date: Feb. 26, 2010

(87) PCT Pub. No.: WO2009/028560
PCT Pub. Date: Mar. 5, 2009

(65) Prior Publication Data
US 2010/0252097 A1 Oct. 7, 2010

(30) Foreign Application Priority Data

Aug. 30, 2007 (JP) .................. 2007-223671

(51) Int. Cl.
*H01L 31/18* (2006.01)
*H01L 31/0264* (2006.01)

(52) U.S. Cl.
CPC ............ *H01L 31/18* (2013.01); *H01L 31/0264* (2013.01)
USPC ...................... 438/93; 136/261; 257/E31.004

(58) Field of Classification Search
CPC ....................... H01L 21/02425; H01L 31/032; H01L 31/0264
USPC ......................................................... 136/261
See application file for complete search history.

(56) References Cited

U.S. PATENT DOCUMENTS

| 4,036,727 A | * | 7/1977 | Rahn .............................. 204/268 |
| 5,169,798 A | * | 12/1992 | Eaglesham et al. ........... 438/493 |
| 5,421,909 A | | 6/1995 | Ishikawa et al. |
| 5,449,924 A | * | 9/1995 | Hur et al. ......................... 257/54 |
| 6,190,937 B1 | | 2/2001 | Nakagawa et al. |

(Continued)

FOREIGN PATENT DOCUMENTS

| JP | 5-335610 A | 12/1993 |
| JP | 7-288334 A | 10/1995 |

(Continued)

OTHER PUBLICATIONS

R. J. Van Overstraeten and R. P. Mertens, "Heavy Doping Effects in Silicon", Solid State Electronics 30(11) p. 1077-1087 (1987).*

(Continued)

*Primary Examiner* — Jeffrey T Barton
*Assistant Examiner* — Eric R Smith
(74) *Attorney, Agent, or Firm* — Fitch, Even, Tabin & Flannery LLP

(57) ABSTRACT

A method for producing a semiconductor material, comprises a step of allowing impurity atoms, Ba atoms and Si atoms to react with each other, the impurity atoms being at least one atom selected from the group consisting of As atom, Sb atom, Bi atom and N atom; and a solar cell comprises the semiconductor material.

8 Claims, 10 Drawing Sheets

(56) References Cited

U.S. PATENT DOCUMENTS

| | | | |
|---|---|---|---|
| 6,444,894 B1 * | 9/2002 | Sterzel | 136/205 |
| 6,756,289 B1 | 6/2004 | Nakagawa et al. | |
| 2003/0110892 A1 | 6/2003 | Nicoloau | |
| 2005/0247338 A1 | 11/2005 | Hakuma et al. | |
| 2006/0180198 A1 | 8/2006 | Takamoto et al. | |

FOREIGN PATENT DOCUMENTS

| | | |
|---|---|---|
| JP | 10-189924 A | 7/1998 |
| JP | 2000-261025 A | 9/2000 |
| JP | 2002-128591 A | 5/2002 |
| JP | 2002-246622 A | 8/2002 |
| JP | 2004-356163 A | 12/2004 |
| JP | 2005-503025 A | 1/2005 |
| JP | 2005-294810 A | 10/2005 |
| JP | 2005-311256 A | 11/2005 |
| JP | 2006-344724 A | 12/2006 |
| JP | 2008-066719 A | 3/2008 |

OTHER PUBLICATIONS

Japanese International Search Report Nov. 25, 2008.

Suemasu T., 'Silicide Handotai No Saishin Doko—Shinsedai Optoelectronics Zairyo—Dai 6 Sho Silicide Handotai no Oyo,' Function & Materials vol. 25, No. 10, Sep. 5, 2005, pp. 54-60.

Suemasu T. et al., 'Tagenkei Silicide No Shintenkai—Handotai Basi$_2$O Rei Ni', Oyo Butsuri, vol. 76, No. 3, Mar. 10, 2007, pp. 264-268.

Suemasu T. et al., 'Atarashii Taiyo Denchi Zairyo O Mezashita Handotai Basi2 Eno Sr Tenka Ni Yoru Bandgap Engineering', National Convention Record I.E.E. Japan, vol. 2006, No. 2, Mar. 15, 2006, p. 130.

Ichikawa Y. et al., 'MBE-Ho Ni Yoru Schottky-Gata Taiyo Denchi Ni Muketa Ba si$_2$/Cosi$_2$/Si Kozo No Sakusei to Hyoka,' The Japan Society of Applied Physics and Related Societies Koenkai Koen Yoshishu, vol. 54, No. 3, Mar. 27, 2007, p. 1455.

Translation of International Preliminary Report on Patentability issued on May 20, 2010 in International Application No. PCT/JP2008/065312.

Neshpor et al, "An Investigation of the Preparation Conditions and Some Properties of Barium Disilicide," Translated from Zhurnal Prikladnoi Khimii (May 2003), vol. 36, No. 5, pp. 1139-1142.

Kishino et al., "Crystal growth of orthorhombic BaSi2 by the vertical Bridgman method," Thin Solid Films (2004), vol. 461, pp. 90-93.

Kobayashi et al, "Growth and characterization of group-III impurity-doped semiconducting BaSi2 films grown by molecular beam epitaxy," Thin Solid Films (2007), vol. 515, pp. 8242-8245.

Ichikawa(1) et al, "Growth of BaSi2/CoSi2/Si(111) Structure by MEB and Characterization of the Same," Textbook for the 10th Summer School on Semiconducting Silicides (2007), pp. 70-71.

Suemasu T. (1), "Future Device Application of Semiconductor Silicides," Function & Materials (2005), vol. 25, No. 10, pp. 54-60.

Suemasu T. (2) et al., "New Developments of Multicomponent Silicides—Taking semiconducting BaSi2 as an example," Applied Physics (2007), vol. 76, No. 3, pp. 264-268.

Suemasu T. (3) et al., "Band-gap-engineering of semiconducting BaSi2 by Sr addition for solar cell application," National Convention Record I.E.E. Japan (Mar. 2006), vol. 2006, No. 2, p. 130.

Ichikawa Y. (2) et al., "Molecular beam epitaxy of BaSi2/CoSi2/Si structure for Schottky Barrier Solar Cels," The Japan Society of Applied Physics and Related Societies Koenkai Koen Yoshishu (Mar. 2007), vol. 54, No. 3, p. 1455.

* cited by examiner

SEMICONDUCTOR MATERIAL, SOLAR CELL USING THE SEMICONDUCTOR MATERIAL, AND METHODS FOR PRODUCING THE SEMICONDUCTOR MATERIAL AND THE SOLAR CELL

CROSS-REFERENCE TO RELATED APPLICATIONS

This Application is the U.S. national phase application under 35 U.S.C. 371 of International Application No. PCT/JP2008/065312, filed Aug. 27, 2008, which designated the United States which claims priority from Japanese Application JP2007-223671, filed Aug. 30, 2007, the complete disclosures of which are hereby incorporated herein by reference in their entirety for all purposes.

TECHNICAL FIELD

The present invention relates to a barium silicide-based semiconductor, a solar cell using the barium silicide-based semiconductor, and methods for producing the barium silicide-based semiconductor and the solar cell.

BACKGROUND OF THE INVENTION

In 95% or above of conventional solar cells, semiconductors consisting of Si materials are used. However, Si semiconductors have a forbidden band gap of 1.1 eV; therefore, conventional solar cells have not achieved sufficiently-high energy conversion efficiency. Moreover, having a small optical absorption coefficient, Si semiconductors need to have a thickness of 100 μm or above for light to be absorbed sufficiently. Accordingly, such Si semiconductors are not suitable for the purpose of making thin solar cells.

There have been attempts to expand the forbidden band gap of silicon-based semiconductors in order to improve their energy conversion efficiency in the solar cells. In Japanese Unexamined Patent Application Publication No. 2005-294810 (Document 1), disclosed is a mixed crystal semiconductor thin film in which $BaSi_2$ is doped with alkaline earth metal atoms, such as Sr atoms, Ca atoms, or Mg atoms. It is disclosed that a mixed crystal semiconductor thin film doped with Sr atoms as the alkaline earth metal atoms especially has a large optical absorption coefficient, and has a forbidden band gap of approximately 1.4 eV.

Meanwhile, it is known that an electron density in a semiconductor is increased by doping impurities. However, it has not been easy to adjust the electron density to a desired value over a wide range of electron density.

DISCLOSURE OF THE INVENTION

The present invention has been made in consideration of the above problems in the conventional techniques. Objects of the present invention are to provide a method for producing a semiconductor material, the method making it possible to easily adjust an electron density of an obtained semiconductor material to a desired value over a wide range of electron density, and to provide a semiconductor material obtained by the method. Other objects of the present invention are to provide a solar cell using the semiconductor material produced as above, and to provide a method for producing the solar cell.

The present inventor has earnestly studied in order to achieve the above objects. As a result, the present inventor has discovered the following. Specifically, when impurity atoms which are at least one atom selected from the group consisting of As atom, Sb atom, Bi atom and N atom are selected as a dopant into a barium silicide-based semiconductor, the controlling of a temperature of a vapor deposition source of the impurity atoms makes it possible to easily adjust an electron density of an obtained semiconductor material to a desired value over a wide range of electron density. This discovery has led the inventor to complete the present invention.

Specifically, a semiconductor material of the present invention comprises Ba atoms; Si atoms; and impurity atoms which are at least one atom selected from the group consisting of As atom, Sb atom, Bi atom and N atom; Ba atoms. The semiconductor material preferably further comprises alkaline earth metal atoms which are at least one atom selected from the group consisting of Sr atom, Ca atom, and Mg atom.

The semiconductor material of the present invention is preferably of n-type, and a thickness thereof is preferably 0.01 μm to 0.1 μm.

A solar cell of the present invention comprises a substrate; a barium silicide layer being arranged on the substrate, and containing Ba atoms and Si atoms; an impurity-doped barium silicide layer being arranged on the barium silicide layer, and containing Ba atoms, Si atoms, and impurity atoms which are at least one atom selected from the group consisting of As atom, Sb atom, Bi atom, and N atom; an upper electrode arranged on the impurity-doped barium silicide layer; and a lower electrode arranged on the substrate.

The solar cell of the present invention preferably further comprises a metal silicide layer between the barium silicide layer and the substrate, the metal silicide layer containing Si atoms, and metal atoms which are at least one of atoms belonging to Groups 9 and 10 of the periodic table. The lower electrode is preferably arranged on a surface of the metal silicide layer.

At least one of the barium silicide layer and the impurity-doped barium silicide layer preferably further contains alkaline earth metal atoms which are at least one atom selected from the group consisting of Sr atom, Ca atom and Mg atom. The barium silicide layer is preferably any one of an epitaxial layer and a highly oriented layer.

A method for producing a semiconductor material of the present invention comprises a step of allowing impurity atoms, Ba atoms, and Si atoms to react with each other, said impurity atoms being at least one atom selected from the group consisting of As atom, Sb atom, Bi atom and N atom. In the production method, alkaline earth metal atoms which are at least one atom selected from the group consisting of Sr atom, Ca atom and Mg atom are preferably additionally allowed to react.

A first method for producing a solar cell comprises steps of forming a barium silicide layer by allowing Si atoms and Ba atoms to react with each other on a substrate; forming an impurity-doped barium silicide layer on a surface of the barium silicide layer by allowing impurity atoms, Ba atoms and Si atoms to react with reach other, said impurity atoms being at least one atom selected from the group consisting of As atom, Sb atom, Bi atom and N atom; forming a lower electrode on the substrate; and forming an upper electrode on a surface of the impurity-doped barium silicide layer.

In the first production method, preferably, at least one surface of the substrate is formed from Si, and in the step of forming the barium silicide layer, the Ba atoms are introduced into the Si surface of the substrate to allow the Si atoms and the Ba atoms to react with each other.

Meanwhile, a second method for producing a solar cell comprises steps of forming a metal silicide layer by allowing Si atoms and metal atoms belonging to any one of Groups 9 and 10 of the periodic table to react with each other on a substrate; forming a barium silicide layer by allowing Ba atoms and Si atoms to react with each other on the metal silicide layer; forming an impurity-doped barium silicide layer on a surface of the barium silicide layer by allowing impurity atoms, Ba atoms and Si atoms to react with each other, said impurity atoms being at least one atom selected from the group consisting of As atom, Sb atom, Bi atom and N atom; forming a lower electrode on at least one of the metal silicide layer and the substrate; and forming an upper electrode on a surface of the impurity-doped barium silicide layer.

In the second production method, preferably, in the step of forming the barium silicide layer, a Si ultrathin layer is formed on a surface of the metal silicide layer, and then the Ba atoms are introduced into the Si ultrathin layer to allow the Ba atoms and the Si atoms to react with each other.

In the first and second production methods, preferably, in at least one of the step of forming the barium silicide layer and the step of forming the impurity-doped barium silicide layer, alkaline earth metal atoms which are at least one atom selected from the group consisting of Sr atom, Ca atom and Mg atom are allowed to react. Moreover, the barium silicide layer is preferably formed by an epitaxy method.

According to the present invention, it is possible to easily adjust an electron density of an obtained semiconductor material to a desired value over a wide range of electron density. It is also possible to obtain a solar cell using the semiconductor material produced as above.

DETAILED DESCRIPTION OF THE PREFERRED EMBODIMENTS

Figure 1:
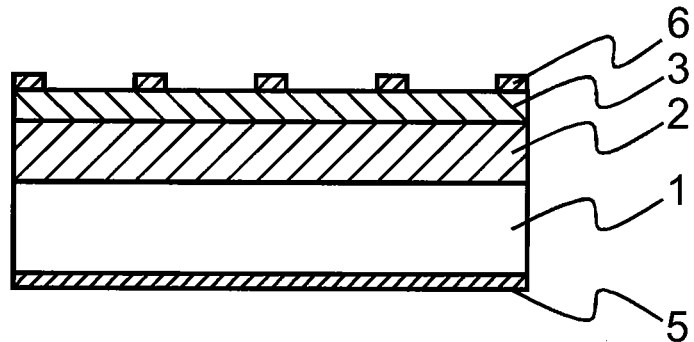
FIG. 1 is a cross-sectional view schematically showing a preferred embodiment of the solar cell of the present invention.

Hereinafter, the present invention will be described in details with reference to preferred embodiments thereof.

Firstly, a semiconductor material of the present invention will be described. The semiconductor material of the present invention comprises Ba atoms; Si atoms; and impurity atoms which are at least one atom selected from the group consisting of As atom, Sb atom, Bi atom and N atom. A conductivity type of the semiconductor material is determined depending on the kind of the impurity atoms, and is preferably an n-type.

Such a semiconductor material can be produced by allowing impurity atoms, Ba atoms, and Si atoms to react with each other, the impurity atoms being at least one atom selected from the group consisting of As atom, Sb atom, Bi atom and N atom. Specific examples thereof include a method in which the impurity atoms, the Ba atoms and the Si atoms are vapor-deposited onto a surface of a substrate or another layer (hereinafter, these are correctively referred to as "a substrate or the like"), and these atoms are allowed to react with each other. By allowing the Ba atoms, the Si atoms, and additionally the impurity atoms to react with each other, in other words, by doping the barium silicide with the impurity atoms, a semiconductor material having an electron density higher than that of a barium silicide (impurity-doped barium silicide) is obtained. Moreover, by controlling a temperature of a vapor deposition source of the impurity atoms, it is possible to easily adjust an electron density of an obtained semiconductor material to a desired value over a wide range of electron density. Specifically, by changing the temperature of the vapor deposition source in a range of preferably 300° C. to 350° C., more preferably 320° C. to 350° C., the electron density of the semiconductor material can be gradually varied in a range of preferably $10^{17}$ cm$^{-3}$ to $10^{20}$ cm$^{-3}$, more preferably $10^{19}$ cm$^{-3}$ to $10^{20}$ cm$^{-3}$. From this perspective, it is particularly preferable to be doped with Sb atoms. Note that the ratio of vapor-deposition rates of the respective atoms (Ba:Si:impurity) is preferably 1.0 to 2.0 nm/min: 0.5 to 1.0 nm/min: 0.00001 to 0.01 nm/min.

The barium silicide according to the present invention can be exemplified by BaSi$_2$; however the barium silicide is not limited to one having an atomic ratio between barium and silicon (Ba:Si) of 1:2.

In terms of being able to obtain a crystal having less lattice defects, more preferred is a method in which the Ba atoms, the Si atoms and the impurity atoms are directly and simultaneously irradiated and vapor-deposited onto the substrate or the like heated at 400° C. to 600° C. under ultrahigh vacuum (preferably, from 0.001 mPa to 0.01 mPa) so as to allow the Ba atoms, the Si atoms and the impurity atoms to react with each other.

The content of the impurity atoms to 1 mol of the Si atoms in the semiconductor material is preferably 0.1 mmol to 3 mmol, and more preferably 1 mmol to 3 mmol. If the content of the impurity atoms falls below the lower limit, the electron density tends to be too small. Meanwhile, if the content exceeds the upper limit, crystal quality of the semiconductor material tends to deteriorate. The thickness of the semiconductor material is preferably 0.01 µm to 0.1 µm.

In producing the semiconductor material, alkaline earth metal atoms which are at least one atom selected from the group consisting of Sr atom, Ca atom and Mg atom are preferably included in the semiconductor material. When the semiconductor material contains the alkaline earth metal atoms, it is possible to expand a forbidden band gap of the semiconductor material.

Moreover, the content of the alkaline earth metal atoms to 1 mol of the Ba atoms in the semiconductor material is preferably approximately 1 mol. When the content of the alkaline earth metal atoms is approximately 1 mol, the forbidden band gap expands to a desired value (1.4 eV), whereby a semiconductor material having favorable crystal quality can be obtained.

Examples of methods of including the alkaline earth metal atoms in the semiconductor material include a method in which, in the vapor-deposition of the Ba atoms, the Si atoms and the impurity atoms, the alkaline earth metal atoms are simultaneously irradiated and vapor-deposited in addition to these atoms, whereby the Ba atoms, the Si atoms, the impurity atoms and the alkaline earth metal atoms are allowed to react with each other. The ratio of vapor-deposition rates of the respective atoms (Ba:Si:impurity:alkaline earth metal) is preferably 1.0 to 2.0 nm/min:0.5 to 1.0 nm/min:0.0001 to 0.001 nm/min:1.0 to 2.0 nm/min.

Next, a solar cell of the present invention will be described. With reference to the drawings, a preferred embodiment of the present invention will be described below in detail. Note that same or corresponding elements are denoted by same reference numerals and redundant descriptions will be omitted throughout the following descriptions and drawings.

Figure 2:
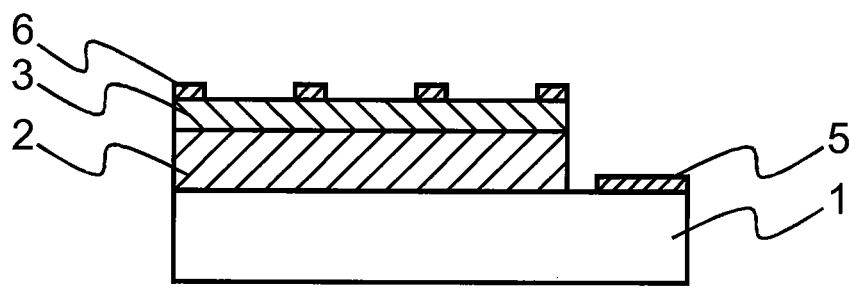
FIG. 2 is a cross-sectional view schematically showing another preferred embodiment of the solar cell of the present invention.

The solar cell of the present invention comprises, as shown in FIG. 1 and FIG. 2, a substrate 1 (preferably, a substrate of which at least one surface is formed from Si); a barium silicide layer 2 being arranged on the substrate 1 (preferably, on the Si surface thereof) and containing Ba atoms and Si atoms; an impurity-doped barium silicide layer 3 being arranged on the barium silicide layer 2 and containing Ba atoms, Si atoms, and impurity atoms which are at least one atom selected from the group consisting of As atom, Sb atom, Bi atom, and N atom; an upper electrode 6 arranged on the impurity-doped barium silicide layer 3; and a lower electrode 5 arranged on the substrate 1 (for example, on a surface thereof).

In the solar cell of the present invention, the barium silicide layer 2 is preferably any one of an epitaxial layer and a highly oriented layer. When the barium silicide layer 2 is any one of an epitaxial layer and a highly oriented layer, it is possible to obtain a solar cell having higher energy conversion efficiency.

As long as the lower electrode 5 is arranged on the substrate 1 (for example, on a surface thereof) so as to be connected electrically to the barium silicide layer 2, the lower electrode 5, for example, may be arranged, as shown in FIG. 1, on the opposite surface of the surface of the substrate 1 on which the barium silicide layer 2 is arranged; or may be arranged, as shown in FIG. 2, on the surface of the substrate 1 on which the barium silicide layer 2 is arranged. Further, the lower electrode 5 may be arranged on both surfaces of the substrate 1.

Figure 3:
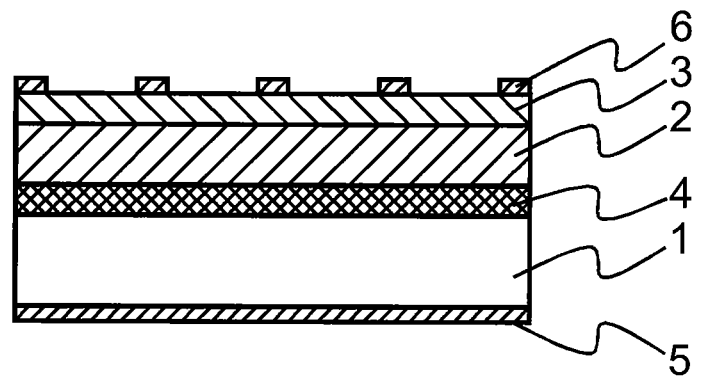
FIG. 3 is a cross-sectional view schematically showing still another preferred embodiment of the solar cell of the present invention.
Figure 4:
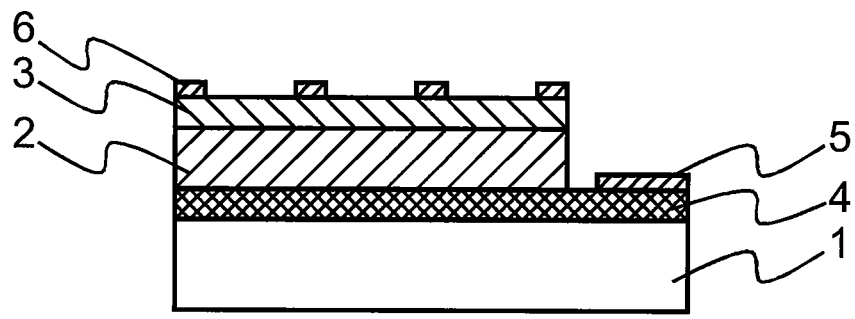
FIG. 4 is a cross-sectional view schematically showing yet another preferred embodiment of the solar cell of the present invention.

The solar cell of the present invention preferably further comprises, as shown in FIG. 3 and FIG. 4, a metal silicide layer 4 between the barium silicide layer 2 and the substrate (preferably, the Si surface thereof), wherein the metal silicide layer 4 contains Si atoms, and metal atoms which are at least one of atoms belonging to Groups 9 and 10 of the periodic table. When the barium silicide layer 2 is formed on the metal silicide layer 4, a barium silicide layer 2 having good crystal quality can be formed. Moreover, a solar cell having a high open voltage can be obtained since the difference between the work function of the metal silicide and electron affinity of the barium silicide is large.

In the solar cell of the present invention comprising the metal silicide layer 4, the lower electrode 5 is arranged on at least one of the metal silicide layer 4 and the substrate 1 (for example, on a surface thereof) so as to be connected electrically to the barium silicide layer 2. For example, the lower electrode 5 may be arranged on the opposite surface of the surface of the substrate 1 on which the metal silicide layer 4 is arranged (FIG. 3), or may be arranged on the surface of the substrate 1 on which the metal silicide layer 4 is arranged (no drawing). Further, the lower electrode 5 may be arranged on the surface of the metal silicide layer 4 on which the barium silicide layer 2 is arranged (FIG. 4), or may be arranged on the opposite surface of the surface of the metal silicide layer 4 on which the barium silicide layer 2 is arranged (no drawing). Otherwise, the arrangement of the lower electrode 5 may be combination of these arrangements. Among these, from the perspective of reducing the total series resistance, including contact resistance with the electrodes, of the solar cell, the lower electrode 5 is preferably arranged on one surface of the metal silicide layer 4.

The solar cell of the present invention can be produced by, for example, the following method. In FIGS. 5A to 5D, cross-sectional views of solar cell members or a solar cell which are obtained at the end of respective steps in the following production method are shown respectively.

In a first method for producing the solar cell of the present invention, firstly, Si atoms and Ba atoms are allowed to react with each other on a substrate 1, (for example, on a surface thereof). The reaction of the Si atoms and the Ba atoms can be carried out, for example, by use of a substrate having at least one surface formed from Si as the substrate 1, and by introducing the Ba atoms into at least one of the Si surface(s). However, the reaction of the Si atoms and the Ba atoms is not limited to the above in the present invention. For example, it is also possible to allow the Si atoms and the Ba atoms to react with each other by introducing the Si atoms and the Ba atoms onto the substrate 1 (for example, onto a surface thereof).

The substrate having at least one surface formed from Si may be entirely made from Si; however, the substrate is preferably prepared by forming a Si layer on a surface of an inexpensive substrate, such as a glass substrate, from an economical point of view. Furthermore, the Si surface into which the Ba atoms will be introduced is more preferably a Si (111) surface in terms of being capable of forming a barium silicide layer 2 having good crystal quality. Examples of methods of forming a (111)-oriented Si layer on a surface of a substrate, such as a glass substrate, include a method described by Oliver Nast and Stuart R. Wenham in Journal of Applied Physics, Vol. 88, 124 (2000). The introduced Ba atoms react with the Si atoms located in the vicinity of the Si surface to form a barium silicide ultrathin layer. The thickness of this barium silicide ultrathin layer is generally from 10 nm to 20 nm.

As a method of introducing the Ba atoms, any publicly-known method of introducing atoms can be adopted; however, publicly-known epitaxy methods, such as a liquid-phase epitaxy method, a vapor-phase epitaxy method, and a molecular beam epitaxy method, are preferable. Among these, more preferred is a method (Reactive Deposition Epitaxy method: RDE method) in which the Ba atoms are vapor-deposited onto the Si surface of the substrate 1 heated at 400° C. to 600° C. under ultrahigh vacuum (preferably, from 0.001 mPa to 0.01 mPa) so as to allow the Ba atoms and the Si atoms to react with each other and to grow epitaxially. By adopting this method, it is possible to obtain a crystal having less lattice defects. The vapor-deposition rate of Ba atom is preferably from 1 nm/min to 2 nm/min.

In the first production method, the barium silicide ultrathin layer may be used without modification as the barium silicide layer 2, or a thick barium silicide layer 2 may be formed through epitaxial growth by allowing Si atoms and Ba atoms to react with each other on the barium silicide ultrathin layer. The thickness of the barium silicide layer 2 is preferably from 0.2 μm to 1.0 μm. If the thickness of the barium silicide layer 2 falls below the lower limit, absorption of sun light tends to be insufficient. Meanwhile, if the thickness exceeds the upper limit, a neutral region having no built-in electric field is present in the barium silicide layer, and hence most of electron-hole pairs generated by light illumination tend to disappear due to recombination.

In the first production method, the barium silicide layer 2 is preferably formed through epitaxial growth to be an epitaxial layer or a highly oriented layer. Examples of methods for the epitaxial growth include publicly-known epitaxy methods, such as a liquid-phase epitaxy method, a vapor-phase epitaxy method, and a molecular beam epitaxy method. Among these, preferred is a method (molecular beam epitaxy method: MBE method) in which the Ba atoms and the Si atoms are simultaneously irradiated and vapor-deposited directly onto the barium silicide ultrathin layer heated at 400° C. to 600° C. under ultrahigh vacuum (preferably, from 0.001 mPa to 0.01 mPa) so as to allow the Ba atoms and the Si atoms to react with each other. By adopting this method, it is possible to obtain a crystal having less lattice defects. The ratio of vapor-deposition rates of the respective atoms (Ba:Si) is preferably 1.0 to 2.0 nm/min: 0.5 to 1.0 nm/min.

In the first production method, alkaline earth metal atoms which are at least one atom selected from the group consisting of Sr atom, Ca atom and Mg atom are preferably included in the barium silicide layer 2. When the barium silicide layer 2 contains the alkaline earth metal atoms, it is possible to expand a forbidden band gap of the barium silicide layer 2; therefore, a solar cell having superior energy conversion efficiency can be obtained.

The content of the alkaline earth metal atoms to 1 mol of the Ba atoms in the barium silicide layer 2 is preferably approximately 1 mol. When the content of the alkaline earth metal atoms is approximately 1 mol, the forbidden band gap tends to expand to a value (1.4 eV) appropriate for a solar cell, whereby a barium silicide layer 2 having favorable crystal quality can be obtained.

Examples of methods of including the alkaline earth metal atoms in the barium silicide layer 2 include a method in which the alkaline earth metal atoms in addition to the Ba atoms and the Si atoms are simultaneously irradiated and vapor-deposited in the epitaxial growth, whereby the Ba atoms, the Si atoms and the alkaline earth metal atoms are allowed to react with each other to grow epitaxially. The ratio of vapor-deposition rates of the respective atoms (Ba:Si:alkaline earth metal) is preferably 1.0 to 2.0 nm/min:0.5 to 1.0 nm/min:1.0 to 2.0 nm/min.

Figure 5A:
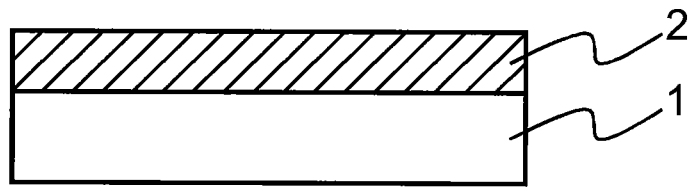
FIG. 5A is a cross-sectional view schematically showing a preferred embodiment of a member for a solar cell (a solar cell member) obtained after formation of a barium silicide layer in the first method for producing a solar cell of the present invention.

FIG. 5A is a cross-sectional view of a solar cell member comprising the barium silicide layer 2 thus obtained on the substrate 1 (for example, on a surface thereof).

Next, an impurity-doped barium silicide layer 3, which is the semiconductor material of the present invention, is formed on a surface of this barium silicide layer 2. Thereby, an impurity-doped barium silicide layer 3 having a desired high electron density can be formed easily. Moreover, a solar cell of which a decrease in energy conversion efficiency due to series resistance is inhibited can be obtained easily since contact resistance between the electrodes and the solar cell is small. From this perspective, Sb atoms are preferably doped.

The content of the impurity atoms to 1 mol of the Si atoms in the impurity-doped barium silicide layer 3 is preferably from 0.1 mmol to 3 mmol, and more preferably from 1 mmol to 3 mmol. If the content of the impurity atoms falls below the lower limit, contact resistance between the electrodes and the solar cell tends to be larger. Meanwhile, if the content exceeds the upper limit, crystal quality of the impurity-doped barium silicide layer tends to deteriorate.

The thickness of the impurity-doped barium silicide layer 3 is preferably from 0.01 μm to 0.1 μm. If the thickness of the impurity-doped barium silicide layer 3 falls under the lower limit, contact resistance between the electrodes and the solar cell tends to be larger. On the other hand, the thickness exceeds the upper limit, sun light is reflected on a surface of the solar cell; therefore, the energy conversion efficiency tends to be decreased.

In the first production method, the alkaline earth metal atoms are preferably included in the impurity-doped barium silicide layer 3 as in the case of the semiconductor material of the present invention. When the impurity-doped barium silicide layer 3 contains the alkaline earth metal atoms, the forbidden band gap of the impurity-doped barium silicide layer 3 can be expanded; therefore, a solar cell having superior energy conversion efficiency can be obtained.

Figure 5B:
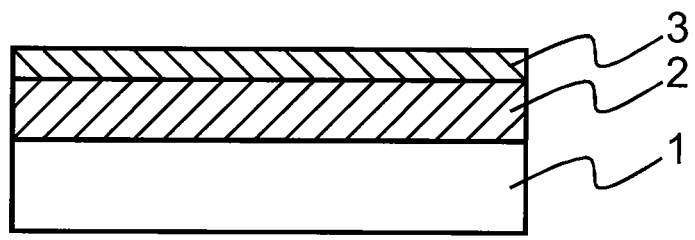
FIG. 5B is a cross-sectional view schematically showing a preferred embodiment of a member for a solar cell (a solar cell member) obtained after formation of an impurity-doped barium silicide layer in the first method for producing a solar cell of the present invention.

FIG. 5B is a cross sectional view of a solar cell member comprising the barium silicide layer 2 and the impurity-doped barium silicide layer 3 which are thus obtained on the substrate 1 (for example, on a surface thereof).

Figure 5C:
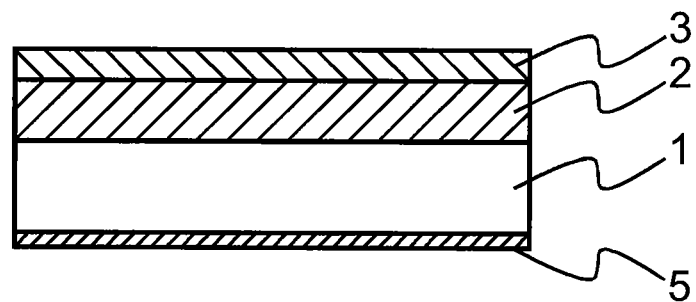
FIG. 5C is a cross-sectional view schematically showing a preferred embodiment of a member for a solar cell (a solar cell member) obtained after formation of a lower electrode in the first method for producing a solar cell of the present invention.
Figure 5D:
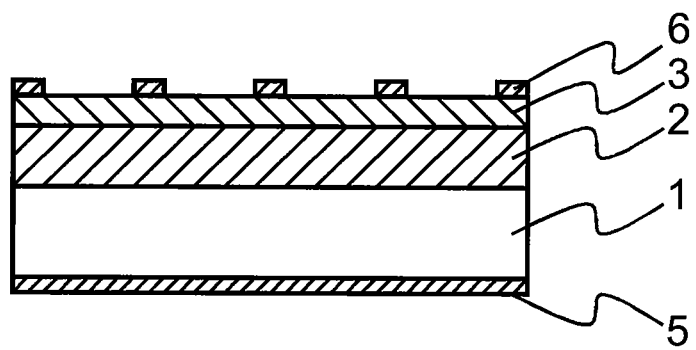
FIG. 5D is a cross-sectional view schematically showing a preferred embodiment of a solar cell obtained after formation of an upper electrode in the first method for producing a solar cell of the present invention.

Subsequently, electrodes are formed in this solar cell member in accordance of a publicly-known method. To be more specific, a lower electrode 5 is formed on the substrate 1 (for example, on a surface thereof) of the solar cell member so as to be connected electrically to the barium silicide layer 2, and an upper electrode 6 is formed on a surface of the impurity-doped barium silicide layer 3. These electrodes can be formed in any order. FIG. 5C is a cross-sectional view of a solar cell member comprising the lower electrode 5 on the opposite surface of the surface of the substrate 1 on which the barium silicide layer 2 is arranged. FIG. 5D is a cross sectional view of a solar cell of the present invention comprising the lower electrode 5 on the opposite surface of the surface of the substrate 1 on which the barium silicide layer 2 is arranged. As shown in FIG. 2, the lower electrode 5 may be formed on the surface of the substrate 1 on which the barium silicide layer 2 is arranged. As the upper electrode 6 and the lower electrode 5, metal electrodes, such as silver electrodes, used in publicly-known solar cells are preferable.

Furthermore, when the solar cell of the present invention comprises the metal silicide layer 4 as shown in FIG. 3 and FIG. 4, the solar cell can be produced in accordance with the following method, for example. FIGS. 6A to 6F are cross-sectional views of solar cell members or a solar cell which are obtained at the end of respective steps in the following production method.

In a second method for producing the solar cell of the present invention, firstly, Si atoms and metal atoms belonging to any one of Groups 9 and 10 of the periodic table are allowed to react with each other on a substrate 1 (for example, on a surface thereof). The reaction between the Si atoms and the metal atoms can be carried out, for example, by use of a substrate having at least one surface formed from Si as the substrate 1, and by introducing the metal atoms belonging to any one of Groups 9 and 10 of the periodic table into at least one surface of the Si surface (s). However, in the present invention, the reaction between the Si atoms and the metal atoms is not limited thereto. For example, it is also possible to allow the Si atoms and the metal atoms belonging to any one of Groups 9 and 10 of the periodic table to react with each other by introducing the Si atoms and the metal atoms belonging to any one of Groups 9 and 10 of the periodic table onto the substrate 1 (for example, onto a surface thereof).

The substrate having at least one surface formed from Si may be entirely made from Si; however, the substrate is preferably prepared by forming a Si layer on a surface of an inexpensive substrate, such as a glass substrate, from an economical point of view. Furthermore, the Si surface into which the metal atoms are introduced is more preferably a Si (111) surface. When the metal atoms are introduced into the Si (111) surface, it is possible to form a metal silicide layer 4 having good crystal quality, and to further form a barium silicide layer 2 having good crystal quality. The introduced metal atoms react with the Si atoms located in the vicinity of the Si surface to form a metal silicide layer 4.

When the metal silicide layer 4 is formed on the substrate 1 (preferably, on the Si surface thereof) as described above, crystal quality of a barium silicide layer 2 to be formed on the metal silicide layer 4 is improved. Moreover, a solar cell having a high open voltage can be obtained since the difference between the work function of the metal silicide and electron affinity of the barium silicide is large. In addition, from this perspective, among the above-described metal silicides, a metal silicide having a lattice constant which is approximate to that of the barium silicide is preferable, a cobalt silicide and a nickel silicide are more preferable, and a cobalt silicide is especially preferable. The cobalt silicide according to the present invention can be exemplified by $CoSi_2$; however, the cobalt silicide is not limited to one having an atomic ratio between cobalt and silicon (Co:Si) of 1:2. In the meantime, the nickel silicide can be exemplified by $NiSi_2$; however, the nickel silicide is not limited to one having an atomic ratio between nickel and silicon (Ni:Si) of 1:2.

The thickness of the metal silicide layer 4 is preferably from 10 nm to 40 nm. If the thickness of the metal silicide layer 4 falls below the lower limit, the resistance of the metal silicide tends to become large. Accordingly, the energy conversion efficiency of the solar cell tends to be decreased. Meanwhile, if the thickness exceeds the upper limit, crystal quality of the metal silicide tends to deteriorate, and crystal quality of the barium silicide layer 2 located thereon tends to deteriorate.

As a method of introducing the metal atoms, any publicly-known method of introducing atoms can be adopted; however, publicly-known epitaxy methods, such as a liquid-phase epitaxy method, a vapor-phase epitaxy method, and a molecular beam epitaxy method, are preferable. Among these, more preferred is a method (Solid Phase Epitaxy method (SPE method)) in which the metal atoms are vapor-deposited onto the Si surface of the substrate 1 under ultra-high vacuum (preferably, from 0.001 mPa to 0.01 mPa) at room temperature, and the metal atoms and the Si atoms are allowed to react with each other by, for example, annealing at 600° C. to 700° C. for 5 minutes to grow epitaxially. By adopting this method, a crystal having less lattice defects can be obtained. The vapor-deposition rate of the metal atoms is preferably from 1 nm/min to 2 nm/min.

Figure 6A:
FIG. 6A is a cross-sectional view schematically showing a preferred embodiment of a member for a solar cell (a solar cell member) obtained after formation of a metal silicide layer in the second method for producing a solar cell of the present invention.

FIG. 6A is a cross-sectional view of a solar cell member comprising the metal silicide layer 4 thus obtained on the substrate 1 (for example, on a surface thereof)

Next, a barium silicide layer 2 is formed by allowing Ba atoms and Si atoms to react with each other on the metal silicide layer 4. In this case, for example, a Si ultrathin layer 2a is formed on a surface of the metal silicide layer 4, and then a crystalline barium silicide layer 2 can be formed on the metal silicide layer 4 by forming a barium silicide layer, which will be described later, by use of this Si ultrathin layer 2a as a template. However, the formation of the barium silicide layer 2 is not limited to the above in the present invention. For example, the barium silicide layer 2 can be formed by introducing the Ba atoms and the Si atoms onto a surface of the metal silicide layer 4. Among these, the former method in which the Si ultrathin layer 2a is formed is preferable, from perspective of being capable of easily forming the barium silicide layer 2.

The thickness of the Si ultrathin layer 2a is preferably from 10 nm to 15 nm. If the thickness of the Si ultrathin layer 2a falls below the lower limit, a barium silicide ultrathin layer, which will be described later, tends to be thin. Meanwhile, if the thickness exceeds the upper limit, the barium silicide ultrathin layer tends to be too thick, whereby crystal quality tends to deteriorate As a method of forming the Si ultrathin layer 2a, any publicly-known method of forming a Si ultrathin layer can be adopted; however, publicly-known epitaxy methods, such as a liquid-phase epitaxy method, a vapor-phase epitaxy method, and a molecular beam epitaxy method, are preferable. Among these, more preferred is a method (Molecular Beam Epitaxy method: MBE method) in which the Si atoms are directly irradiated and vapor-deposited onto the metal silicide layer 4 heated at 500° C. to 600° C. under ultrahigh vacuum (preferably, from 0.001 mPa to 0.01 mPa), whereby the Si atoms are deposited. By adopting this method, a crystal having less lattice defects can be obtained. The vapor-deposition rate of the Si atoms is preferably from 0.5 nm/min to 1.0 nm/min.

Figure 6B:
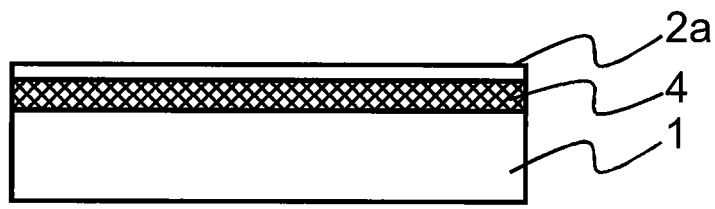
FIG. 6B is a cross-sectional view schematically showing a preferred embodiment of a member for a solar cell (a solar cell member) obtained after formation of a Si ultrathin layer in the second method for producing a solar cell of the present invention.

FIG. 6B is a cross-sectional view of a solar cell member comprising the Si ultrathin layer 2a and the metal silicide layer 4 which are thus obtained on the substrate 1 (for example, on a surface thereof).

Subsequently, Ba atoms are introduced into this Si ultrathin layer 2a. The introduced Ba atoms react with Si atoms in the Si ultrathin layer 2a to form a barium silicide ultrathin layer. The thickness of this barium silicide ultrathin layer is preferably from 10 nm to 20 nm. As a method of introducing the Ba atoms, a method similar to that in the first production method is preferable. In terms of being able to obtain a crystal having less lattice defects, a Reactive Deposition Epitaxy method (RDE method) is more preferable.

Also in the second production method, similarly to the case of the first production method, the barium silicide ultrathin layer may be used without modification as a barium silicide layer 2, or a thick barium silicide layer 2 may be formed by allowing Si atoms and Ba atoms to react with each other on the barium silicide ultrathin layer and to grow epitaxially. In the second production method, the barium silicide layer 2 is also preferably formed by epitaxial growth to be an epitaxial layer or a highly oriented layer. The thickness of the barium silicide layer 2, a method of the epitaxial growth, and the content of alkaline earth metal atoms are similar to those in the case of the first production method.

Figure 6C:
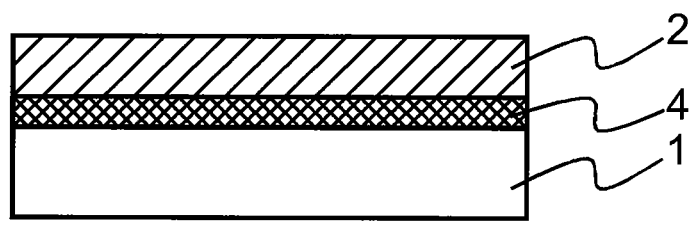
FIG. 6C is a cross-sectional view schematically showing a preferred embodiment of a member for a solar cell (a solar cell member) obtained after formation of a barium silicide layer in the second method for producing a solar cell of the present invention.

FIG. 6C is a cross-sectional view of a solar cell member comprising the metal silicide layer 4 and the barium silicide layer 2 which are thus obtained on the substrate 1 (for example, on a surface thereof).

Next, from the perspective similar to the case of the first production method, an impurity-doped barium silicide layer 3, which is the semiconductor material of the present invention, is formed on a surface of the barium silicide layer 2. The content of the impurity atoms in the impurity-doped barium silicide layer 3, the thickness thereof, a doping method of the impurity atoms, and the content of the alkaline earth metal atoms are similar to those in the case of the first production method.

Figure 6D:
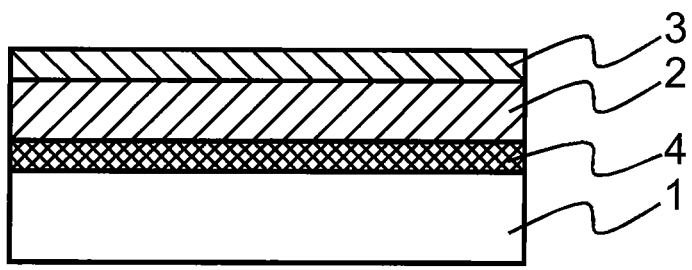
FIG. 6D is a cross-sectional view schematically showing a preferred embodiment of a member for a solar cell (a solar cell member) obtained after formation of an impurity-doped barium silicide layer in the second method for producing a solar cell of the present invention.

FIG. 6D is a cross-sectional view of a solar cell member comprising the metal silicide layer 4, the barium silicide layer 2, and the impurity-doped barium silicide layer 3 which are thus obtained on the substrate 1 (for example, on a surface thereof).

Figure 6E:
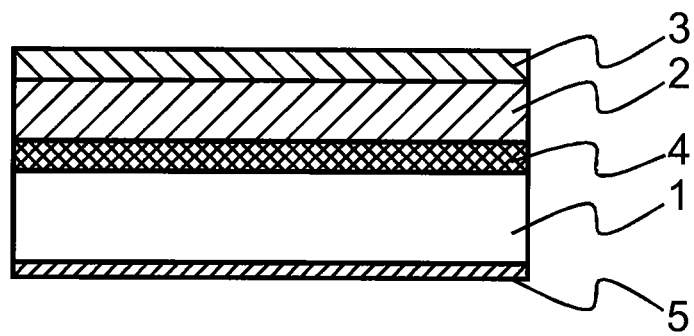
FIG. 6E is a cross-sectional view schematically showing a preferred embodiment of a member for a solar cell (a solar cell member) obtained after formation of a lower electrode in the second method for producing a solar cell of the present invention.
Figure 6F:
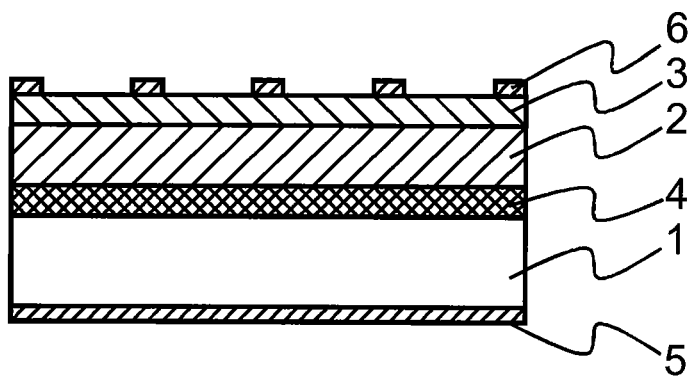
FIG. 6F is a cross-sectional view schematically showing a preferred embodiment of a solar cell obtained after formation of an upper electrode in the second method for producing a solar cell of the present invention.

Thereafter, electrodes are formed in this solar cell member similarly to the case of the first production method. An upper electrode 6 is formed on a surface of the impurity-doped barium silicide layer 3, and a lower electrode 5 is formed on at least one of the metal silicide layer 4 and the substrate 1 (for example, on a surface thereof) so as to be connected electrically to the metal silicide layer 4. These electrodes can be formed in any order. FIG. 6E is a cross-sectional view of a solar cell member comprising the lower electrode 5 on the opposite surface of the surface of the substrate 1 on which the metal silicide layer 4 is arranged, and FIG. 6F is a cross-sectional view of a solar cell of the present invention comprising the lower electrode 5 on the opposite surface of the surface of the substrate 1 on which the metal silicide layer 4 is arranged. The lower electrode 5 may be formed on the surface of the substrate 1 on which the metal silicide layer 4 is arranged (no drawing), may be formed on the surface of the metal silicide layer 4 on which the barium silicide layer 2 is arranged (FIG. 4), or may be formed on the opposite surface of the surface of the metal silicide layer 4 on which the barium silicide layer 2 is arranged (no drawing). As the upper electrode 6 and the lower electrode 5, metal electrodes, such as silver electrodes, used in publicly-known solar cells are preferable.

According to the method for producing a solar cell of the present invention, it is possible to easily adjust an electron density of the impurity-doped barium silicide layer to a desired value over a wide range of electron density. Moreover, in the obtained solar cell of the present invention, an impurity-doped barium silicide layer 3 having a high electron density is formed on the barium silicide layer 2. Hence, contact resistance with the electrodes is small. Accordingly, it is possible to inhibit a decrease in energy conversion efficiency due to series resistance. Furthermore, since a barium silicide has a high optical absorption coefficient (100 times that of Si), it is possible to absorb sufficient sun light even when the thicknesses of the barium silicide layer 2 and the impurity-doped barium silicide layer 3 are reduced. Moreover, by reducing the thicknesses thereof, the amount of Si can be reduced; therefore, large build-in potential can be applied throughout the whole light absorption region. In addition, since the barium silicide layer 2 has high crystal quality and a low lattice defect density, a large built-in potential in a Schottky junction formed between the substrate 1 (preferably, the Si surface thereof) or the metal silicide layer 4 and the barium silicide layer 2 can be attained. These contribute to superior energy conversion efficiency of the solar cell of the present invention.

EXAMPLES

The present invention will be described more specifically on the basis of Examples and Comparative Examples; however, the present invention is not limited to the following Examples. Note that characteristics of obtained solar cell members were evaluated in accordance with the following methods.

(1) X-ray Diffraction (XRD)

Crystal structure of a solar cell member was observed by use of an X-ray diffractometer (RINT2000 series made by Rigaku Corporation).

(2) Conductivity Type, Carrier Density and Resistivity

Conductivity type, carrier density and resistivity were evaluated by Hall measurement. Measurement was carried out at room temperature by using R6240A made by Advantest Corporation as a current source, R6441D made by Advantest Corporation as a voltmeter, and a direct-current power source made by Denshijiki Industry Co., Ltd. as a magnetic field-generating source.

(3) Current-Voltage Characteristics (Dark-Current Characteristics)

Bias voltages from −9 V to +9 V were applied to a substrate or a metal silicide layer of an obtained solar cell with respect to an impurity-doped barium silicide layer by using a curve tracer (made by Kikusui Electronics Corporation, model: 5802) at room temperature, and the amount of current flowing was measured by using the curve tracer.

Example 1

Firstly, a p-type Si (111) substrate (having a resistivity of 1000 Ω·cm or higher and a thickness of 525 μm) was heated in an ultrahigh vacuum chamber (at 0.0001 mPa) of a molecular beam epitaxy crystal growth apparatus (made by RIBER, model: MBE-2300) at 850° C. for 30 minutes, to remove an oxidized film on the substrate surface. Thus, a Si (111) clean surface was obtained.

Next, while the Si substrate was heated at 550° C., Ba atoms were vapor-deposited onto the Si (111) clean surface at a vapor-deposition rate of 1.5 nm/min, and the Ba atoms and Si atoms were allowed to react with each other. Thus, a barium silicide layer having a thickness of 20 nm was formed on the Si (111) clean surface.

Figure 7:
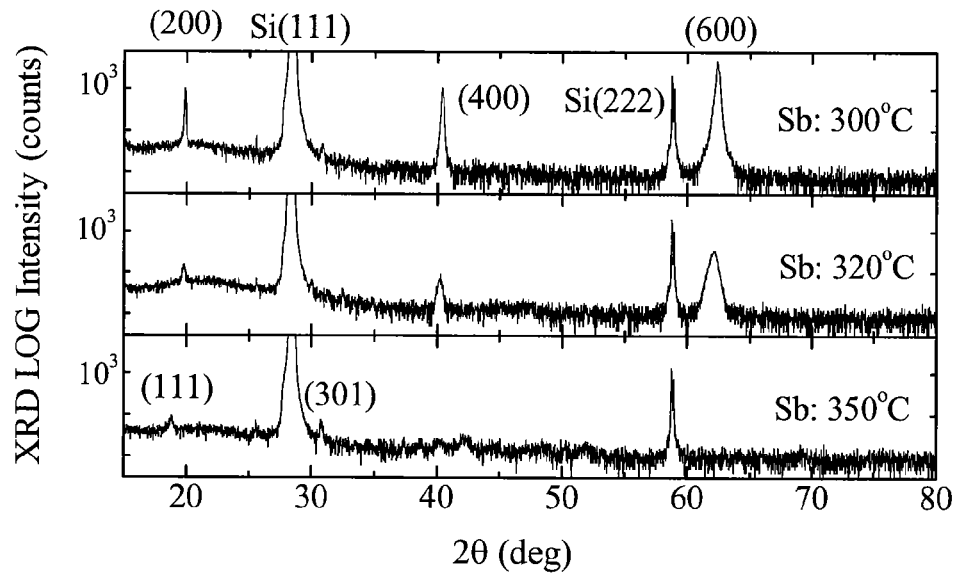
FIG. 7 is a graph showing X-ray diffraction patterns of Sb-doped barium silicide layers obtained in Example 1.

Next, while a vapor deposition source of Sb was heated at a temperature from 300° C. to 350° C., and while the Si substrate of which a surface was the barium silicide layer was heated at 600° C., Ba atoms (at a vapor-deposition rate of 1.5 nm/min), Si atoms (at a vapor-deposition rate of 0.8 nm/min) and Sb atoms (at a vapor-deposition rate of $1.5 \times 10^{-5}$ nm/min (300° C.) to $1.5 \times 10^{-2}$ nm/min (350° C.)) were simultaneously vapor-deposited onto a surface of the barium silicide layer, and the Ba atoms, the Si atoms and the Sb atoms were allowed to react with each other. Thus, an Sb-doped barium silicide layer, which is the semiconductor material of the present invention, having a thickness of 200 nm was formed on the barium silicide layer. FIG. 7 shows X-ray diffraction patterns of such Sb-doped barium silicide layers.

Figure 8:
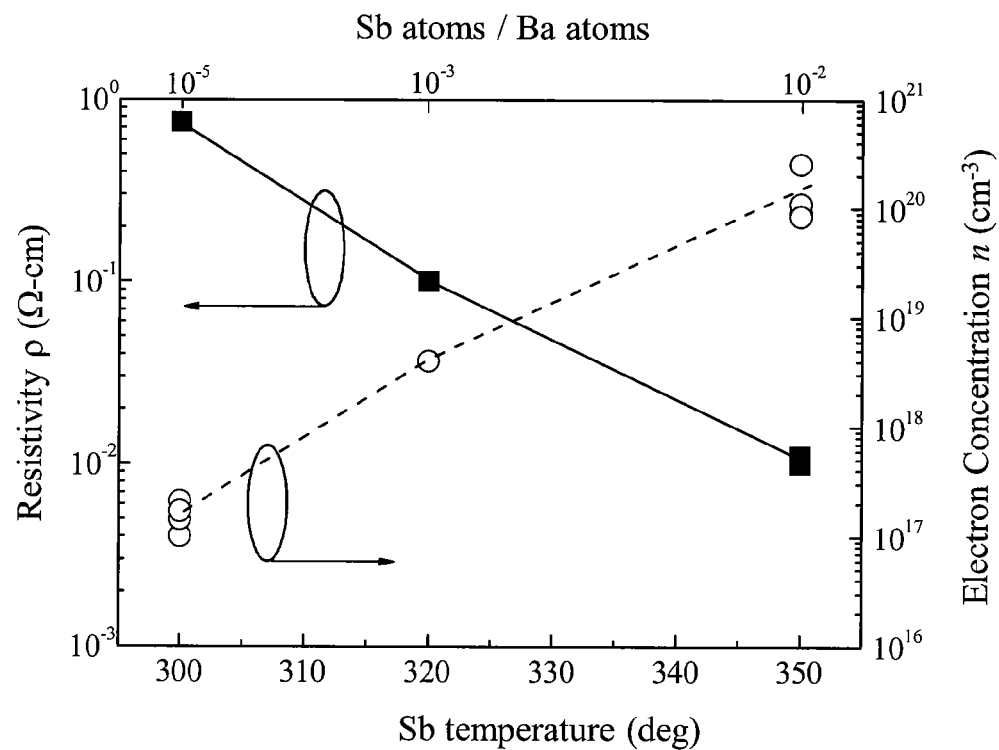
FIG. 8 is a graph showing a relationship between electron densities (electron concentrations) or resistivities of the Sb-doped barium silicide layers obtained in Example 1 and temperatures of a vapor deposition source of Sb.

Conductivity type, carrier density, and resistivity of the obtained Sb-doped barium silicide layers were measured by the method described in the above-described (2). The conductivity type of the Sb-doped barium silicide layers was an n-type. FIG. 8 shows a relationship between the temperatures of the vapor deposition source of Sb and the electron densities (electron concentrations) or the resistivities of the Sb-doped barium silicide layers. Note that the direction of current in the Hall measurement was the surface direction, the resistivity of the Si substrate used was large, and the conductivity type thereof was different from those of the barium silicide layer and the Sb-doped barium silicide layer. Hence, no current flowed through the Si substrate, and a current flowed through only these layers. Accordingly, it was possible to measure the electron density and the resistivity of such a Sb-doped barium silicide layer by the Hall measurement.

Comparative Example 1

Figure 9:
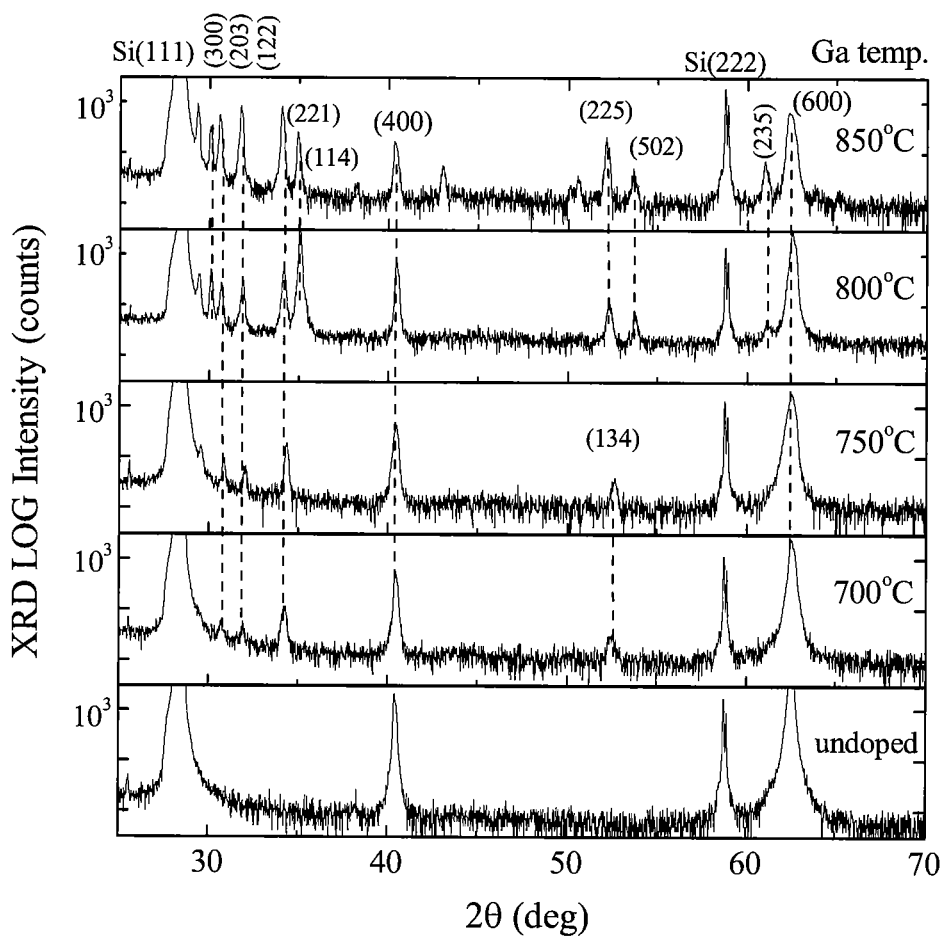
FIG. 9 is a graph showing X-ray diffraction patterns of Ga-doped barium silicide layers obtained in Comparative Example 1.

Ga-doped barium silicide layers were formed in the same manner as in Example 1, except that Ga atoms were doped in place of the Sb atoms, and that the heating temperature of a vapor deposition source of Ga was set to temperatures from 700° C. to 850° C. FIG. 9 shows X-ray diffraction patterns of the Ga-doped barium silicide layers.

Figure 10:
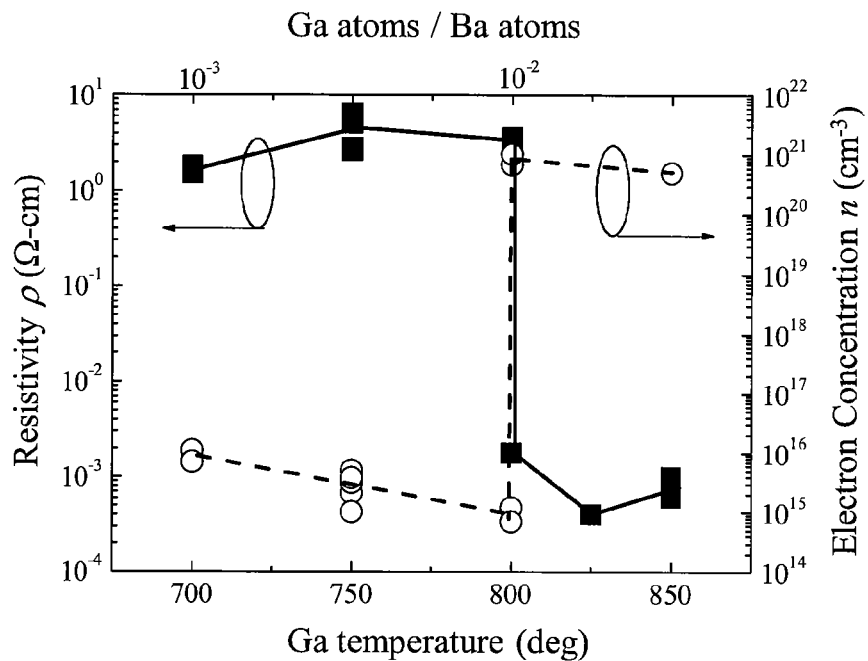
FIG. 10 is a graph showing a relationship among electron densities (electron concentrations) or resistivities of the Ga-doped barium silicide layers obtained in Comparative Example 1 and temperatures of a vapor deposition source of Ga.

Conductivity type, carrier density and resistivity of the obtained Ga-doped barium silicide layers were measured by the method described in the above-described (2). The conductivity type of the Ga-doped barium silicide layers was an n-type. FIG. 10 shows a relationship between the temperatures of the vapor deposition source of Ga and the electron densities (electron concentrations) or the resistivities of the Ga-doped barium silicide layers. Note that, also in this case, it was possible to measure the electron density and the resistivity of such a Ga-doped barium silicide layer, for the same reason as in Example 1

Comparative Example 2

Figure 11:
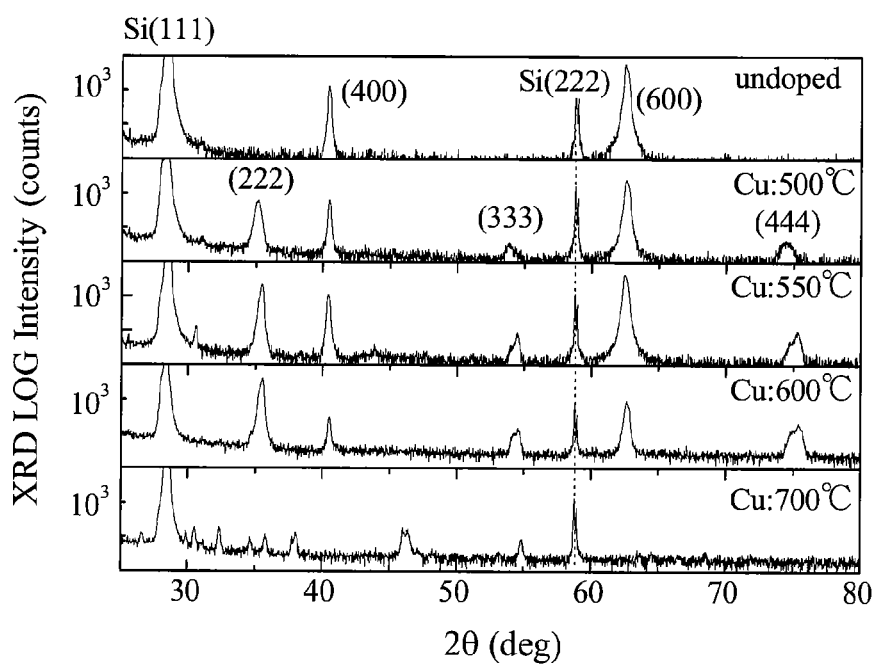
FIG. 11 is a graph showing X-ray diffraction patterns of Cu-doped barium silicide layers obtained in Comparative Example 2.

Cu-doped barium silicide layers were formed in the same manner as in Example 1, except that Cu atoms were doped in place of the Sb atoms, and that the heating temperature of a vapor deposition source of Cu was set to temperatures from 550° C. to 700° C. FIG. 11 shows X-ray diffraction patterns of the Ga-doped barium silicide layers.

Figure 12:
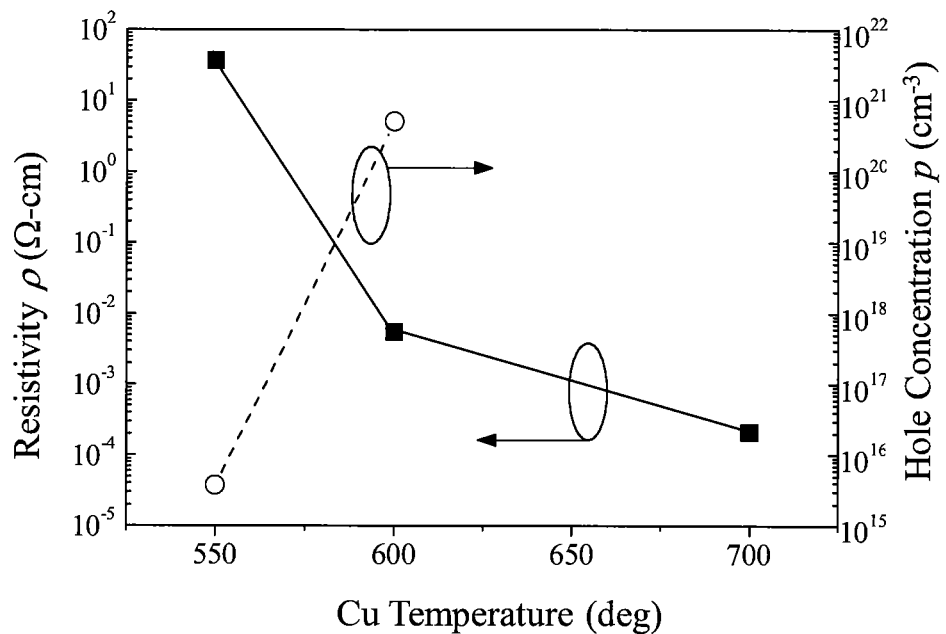
FIG. 12 is a graph showing a relationship among hole densities (hole concentrations) or resistivities of the Cu-doped barium silicide layers obtained in Comparative Example 2 and temperatures of a vapor deposition source of Cu.

Conductivity type, carrier density and resistivity of the obtained Cu-doped barium silicide layers were measured by the method described in the above-described (2). The conductivity type of the Cu-doped barium silicide layers was a p-type. FIG. 12 shows a relationship between the temperatures of the vapor deposition source of Cu and the hole densities (hole concentrations) or the resistivities of the Cu-doped barium silicide layers. Note that, in this case, the conductivity type of the Si substrate was the same as that of the Cu-doped barium silicide layer; however, the valence band of Si has a band discontinuity of approximately 0.5 eV relative to holes in the barium silicide due to a forbidden band gap between Si and barium silicide and a difference in electron affinity therebetween. Accordingly, the hole current flowing through the barium silicide did not flow through Si As a result, it was possible to measure the hole density and the resistivity of such a Cu-doped barium silicide layer.

As apparent from the results shown in FIG. 7, FIG. 9, and FIG. 11, it was found out that, when any impurity atoms of Sb atoms, Ga atoms and Cu atoms were doped, the impurity-doped barium silicide layer came to have a disturbed a-axis orientation, and came to be polycrystalline, as the heating temperature of the vapor deposition source increased.

As apparent from the results shown in FIG. 8, it was found out that, in a case of the Sb-doped barium silicide layer (Example 1), which is the semiconductor material of the present invention, it was possible to vary gradually the resistivity and the electron density over wide ranges, by controlling the heating temperature of the vapor deposition source, and to easily obtain a semiconductor material having a desired electron density and a desired resistivity in a wide range. Meanwhile, as apparent from the results shown in FIG. 10, in a case of the Ga-doped barium silicide layer (Comparative Example 1), the electron density and the resistivity were varied drastically to a large extent at a heating temperature of the vapor deposition source of 800° C. For this reason, it was not possible to easily obtain a semiconductor material having a desired electron density and a desired resistivity in a wide range. Meanwhile, as apparent from the results shown in FIG. 12, in a case of the Cu-doped barium silicide layer (Comparative Example 2), the hole density was varied drastically to a large extent in a range of the heating temperature of the vapor deposition source from 550° C. to 600° C., whereby it was not possible to obtain a semiconductor material having a desired hole density in a wide range.

Example 2

Figure 13:
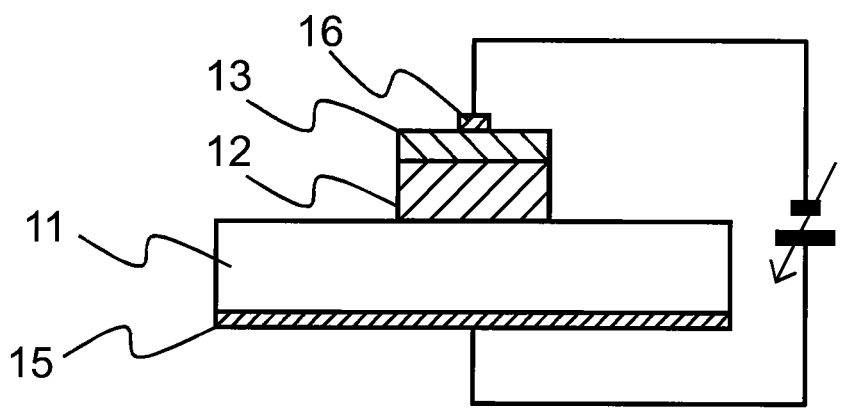
FIG. 13 is a cross-sectional view of a diode (solar cell) fabricated in Example 2.

A diode (solar cell) having a mesa structure shown in FIG. 13 (where a barium silicide layer 12 and an Sb-doped barium silicide layer 13 each had an area of 1 mm$^2$) and comprising a semiconductor material having an electron density of $5 \times 10^{19}$ cm$^{-3}$ was fabricate. Firstly, by using, as a substrate, an n-type Si (111) substrate 11 (having a resistivity of 1000 Ω·cm or higher, and a thickness of 525 μm), a Si (111) clean surface was obtained in the same manner as in Example 1. Next, while the Si substrate 11 was heated at 550° C., Ba atoms were vapor-deposited onto the Si (111) clean surface at a vapor-deposition rate of 1.5 nm/min, and the Ba atoms and the Si atoms were allowed to react with each other. Thus, a barium silicide ultrathin layer having a thickness of 20 nm was formed on the Si (111) clean surface.

Next, a barium silicide layer was grown by use of the barium silicide ultrathin layer as a template. To be more specific, while the solar cell member comprising the barium silicide ultrathin layer formed therein was heated at 600° C., Ba atoms (at a vapor-deposition rate of 1.5 nm/min) and Si atoms (at a vapor-deposition rate of 0.8 nm/min) were simultaneously vapor-deposited onto a surface of the barium silicide ultrathin layer, whereby the Ba atoms and the Si atoms were allowed to react with each other. Thus, a barium silicide layer 12 having a thickness of 200 nm was formed on the Si (111) clean surface.

Next, in order to form the semiconductor material having the above-mentioned electron density, the heating temperature of a vapor deposition source of Sb was set to 340° C. in accordance with FIG. 8. While the solar cell member comprising the barium silicide layer 12 formed therein was heated at 600° C., Ba atoms (at a vapor-deposition rate of 1.5 nm/min), Si atoms (at a vapor-deposition rate of 0.8 nm/min) and Sb atoms (at a vapor-deposition rate of 0.001 nm/min) were simultaneously vapor-deposited onto a surface of the barium silicide layer 12, whereby the Ba atoms, the Si atoms and the Sb atoms were allowed to react with each other. Thus, an Sb-doped barium silicide layer 13, which is semiconductor material of the present invention, having a thickness of 20 nm was formed on the barium silicide layer 12. The conductivity type and the electron density of the Sb-doped barium silicide layer 13 were checked by the Hall measurement. As a result, the Sb-doped barium silicide layer 13 was of an n-type with an electron density of $5 \times 10^{19}$ cm$^{-3}$.

Figure 15:
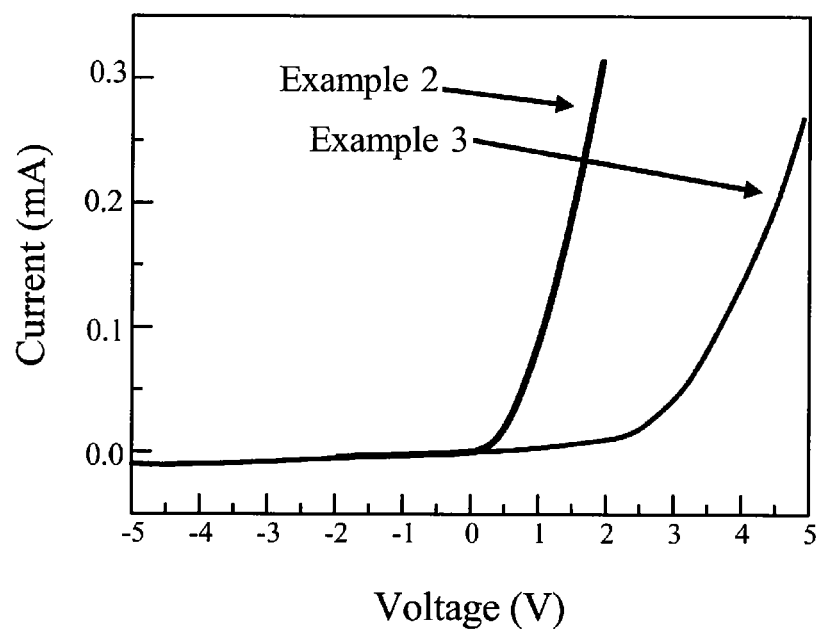
FIG. 15 is a graph showing dark-current characteristics of the diodes (solar cells) fabricated in Examples 2 and 3.

Thereafter, a lower electrode 15 and an upper electrode 16 were formed, as shown in FIG. 13, by use of silver paste on a surface of the substrate 11 and on a surface of the Sb-doped barium silicide layer 13, respectively, in a solar cell member after formation of the Sb-doped barium silicide layer 13. Thus, a diode (solar cell) was obtained. Dark-current characteristics of this diode were measured at room temperature. FIG. 15 shows the result. Note that, in the measurement of the dark-current characteristics, since the direction of current was the thickness direction of the Si substrate 11, resistance in the thickness direction of the Si substrate 11 was small, and voltage drop due to the Si substrate 11 was negligible within the range of the measurement.

Example 3

Figure 14:
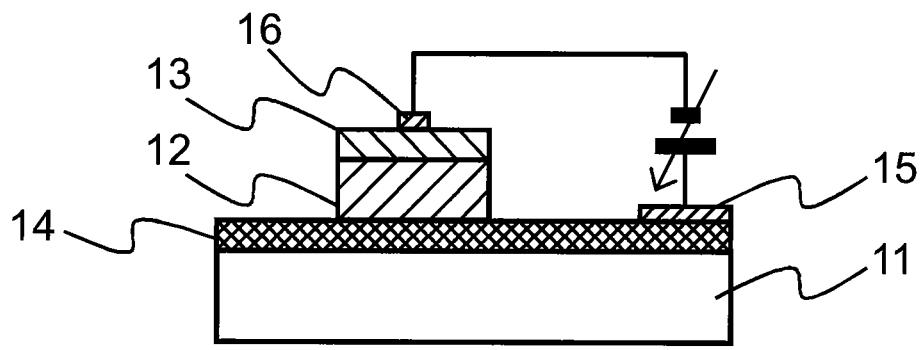
FIG. 14 is a cross-sectional view of a diode (solar cell) fabricated in Example 3.

A diode (solar cell) having a mesa structure shown in FIG. 14 (where a barium silicide layer 12 and an Sb-doped barium silicide layer 13 each had an area of 1 mm$^2$), and comprising a semiconductor material having an electron density of $5 \times 10^{19}$ cm$^{-3}$ was fabricated. Firstly, by using, as a substrate, a p-type Si (111) substrate 11 (having a resistivity of 1000 Ω·cm or higher, and a thickness of 525 μm), a Si (111) clean surface was obtained in the same manner as in Example 1. Next, Co molecules were vapor-deposited onto the Si (111) clean surface at a vapor-deposition rate of 2 nm/min at room temperature. Thus, a Co layer having a thickness of 7 nm was formed on the Si substrate 11. This substrate was subjected to an annealing treatment at 700° C. for 5 minutes, whereby the Co atoms and the Si atoms were reacted with each other. Thus, a cobalt silicide layer 14 having a thickness of 20 nm was formed on the Si substrate 11.

Next, while the solar cell member comprising the cobalt silicide layer 14 formed therein was heated at 590° C., Si atoms were vapor-deposited onto a surface of the cobalt silicide layer 14 at a vapor-deposition rate of 1 nm/min. Thus, a Si ultrathin layer having a thickness of 10 nm was formed on the cobalt silicide layer 14.

Next, while the solar cell member comprising the Si ultrathin layer formed therein was heated at 550° C., Ba atoms were vapor-deposited onto a surface of the Si ultrathin layer at a vapor-deposition rate of 1.5 nm/min, whereby the Ba atoms and the Si atoms were allowed to react with each other. Thus, a barium silicide ultrathin layer having a thickness of 20 nm was formed on the cobalt silicide layer 14.

Next, a barium silicide layer was grown by use of the barium silicide ultrathin layer as a template. To be more specific, while the solar cell member comprising the barium silicide ultrathin layer formed therein was heated at 600° C., Ba atoms (at a vapor-deposition rate of 1.5 nm/min) and Si atoms (at a vapor-deposition rate of 0.8 nm/min) were simultaneously vapor-deposited onto a surface of the barium silicide ultrathin layer, whereby the Ba atoms and the Si atoms were allowed to react with each other. Thus, a barium silicide layer 12 having a thickness of 200 nm was formed on the cobalt silicide layer 14.

Next, an Sb-doped barium silicide layer 13, which is the semiconductor material of the present invention, having a thickness of 20 nm was formed on the barium silicide layer 12 in the same manner as in Example 2, except that the solar cell member comprising the barium silicide layer 12 formed therein was used. Note that, as similar to Example 2, in order to form the semiconductor material having the above-mentioned electron density, the heating temperature of the vapor deposition source of Sb was set to 340° C. in accordance with FIG. 8. The conductivity type and the electron density of the Sb-doped barium silicide layer 13 were checked by the Hall measurement. As a result, the Sb-doped barium silicide layer 13 was of an n-type with an electron density of $5 \times 10^{19}$ cm$^{-3}$.

Thereafter, a lower electrode 15 and an upper electrode 16 were formed, as shown in FIG. 14, by use of silver paste on a surface of the cobalt silicide layer 14 and a surface of the Sb-doped barium silicide layer 13, respectively, in the solar cell member after formation of the Sb-doped barium silicide layer 13. Thus, a diode (solar cell) was obtained. Dark-current characteristics of this diode were measured at room temperature. FIG. 15 shows the results. Note that, in the measurement of the dark-current characteristics, since the lower electrode 15 was formed on the surface of the cobalt silicide layer 14, resistance of the Si substrate 11 had no influence.

As apparent from the results shown in FIG. 15, the diodes (Examples 2 and 3) each comprising the semiconductor material of the present invention exhibited clear rectifying properties with a large current under forward bias in which a positive voltage was applied to any one of the Si substrate and the cobalt silicide layer with respect to the Sb-doped barium silicide layer, and a smaller current under reverse bias. Hence, it was shown that the diodes were useful as solar cells.

When the same voltage was applied in the forward direction, the amount of current was extremely smaller in the diode comprising the cobalt silicide layer (Example 3) than in the diode without the cobalt silicide layer (Example 2). This means that barrier height of the barium silicide layer for electrons in the cobalt silicide layer was extremely larger than the barrier height of the barium silicide layer for electrons in the n-type Si. Such height of the barrier corresponded to the maximum value of open voltage in a solar cell. Accordingly, it was confirmed that the diode comprising the cobalt silicide layer was useful as a solar cell having a larger open voltage.

INDUSTRIAL APPLICABILITY

As described above, according to the present invention, when impurity atoms which are at least one atom selected from the group consisting of As atom, Sb atom, and Bi atom are selected as a dopant into a barium silicide-based semiconductor, the controlling of a temperature of a vapor deposition source of the impurity atoms makes it possible to easily adjust an electron density of a obtained semiconductor material to a desired value over a wide range of electron density.

Accordingly, a method for producing a semiconductor material of the present invention is useful as a method of efficiently producing barium silicide-based semiconductor materials having various electron densities.

The invention claimed is:

1. A method for producing a solar cell, comprising steps of:
    forming a barium silicide layer by allowing Si atoms and Ba atoms to react with each other on a substrate;
    forming an impurity-doped barium silicide layer on a surface of the barium silicide layer by vapor-depositing impurity atoms, which are Sb atoms, Ba atoms and Si atoms on the surface of the barium silicide layer and allowing the atoms to react with each other, wherein during said vapor-depositing a temperature of a vapor deposition source of the impurity atoms is controlled in a range of 300° C. to 350° C. to thereby adjust an electron density of the impurity-doped barium silicide layer to a value in a range of $10^{17}$ cm$^{-3}$ to $10^{20}$ cm$^{-3}$;
    forming a lower electrode on the substrate; and
    forming an upper electrode on a surface of the impurity-doped barium silicide layer.

2. The method for producing a solar cell according to claim 1, wherein
    at least one surface of the substrate is formed from Si, and
    in the step of forming the barium silicide layer, the Ba atoms are introduced into the Si surface of the substrate to allow the Si atoms and the Ba atoms to react with each other.

3. The method for producing a solar cell according to claim 1, wherein, in at least one of the step of forming the barium silicide layer and the step of forming the impurity-doped barium silicide layer, alkaline earth metal atoms which are at least one atom selected from the group consisting of Sr atom, Ca atom, and Mg atom are additionally allowed to react.

4. The method for producing a solar cell according to claim 1, wherein the barium silicide layer is formed by an epitaxy method.

5. A method for producing a solar cell, comprising steps of:
    forming a metal silicide layer by allowing Si atoms and metal atoms belonging to any one of Groups 9 and 10 of the periodic table to react with each other on a substrate;
    forming a barium silicide layer by allowing Ba atoms and Si atoms to react with each other on the metal silicide layer;
    forming an impurity-doped barium silicide layer on a surface of the barium silicide layer by vapor-depositing impurity atoms, which are Sb atoms, Ba atoms and Si atoms on the surface of the barium silicide layer and allowing the atoms to react with each other, wherein during said vapor-depositing a temperature of a vapor deposition source of the impurity atoms is controlled in a range of 300° C. to 350° C. to thereby adjust an electron density of the impurity-doped barium silicide layer to a value in a range of $10^{17}$ cm$^{-3}$ to $10^{20}$ cm$^{-3}$;
    forming a lower electrode on at least one of the metal silicide layer and the substrate; and
    forming an upper electrode on a surface of the impurity-doped barium silicide layer.

6. The method for producing a solar cell according to claim 5, wherein, in the step of forming the barium silicide layer, a Si ultrathin layer is formed on a surface of the metal suicide layer, and then the Ba atoms are introduced into the Si ultrathin layer to allow the Ba atoms and the Si atoms to react with each other.

7. The method for producing a solar cell according to claim 5, wherein, in at least one of the step of forming the barium silicide layer and the step of forming the impurity-doped barium silicide layer, alkaline earth metal atoms which are at least one atom selected from the group consisting of Sr atom, Ca atom and Mg atom are allowed to react.

8. The method for producing a solar cell according to claim 5, wherein the barium silicide layer is formed by an epitaxy method.

* * * * *